(12) United States Patent
Patidar et al.

(10) Patent No.: US 11,837,308 B2
(45) Date of Patent: Dec. 5, 2023

(54) SYSTEMS AND METHODS TO DETECT CELL-INTERNAL DEFECTS

(71) Applicant: Taiwan Semiconductor Manufacturing Company, Ltd., Hsinchu (TW)

(72) Inventors: Ankita Patidar, San Jose, CA (US); Sandeep Kumar Goel, Dublin, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/713,904

(22) Filed: Apr. 5, 2022

(65) Prior Publication Data
US 2022/0230699 A1 Jul. 21, 2022

Related U.S. Application Data (63) Continuation of application No. 16/912,156, filed on Jun. 25, 2020, now Pat. No. 11,295,831.

(51) Int. Cl.
*G01R 31/28* (2006.01)
*G11C 29/44* (2006.01)
(Continued)

(52) U.S. Cl.
CPC ...... *G11C 29/44* (2013.01); *G01R 31/318342* (2013.01); *G01R 31/318547* (2013.01);
(Continued)

(58) Field of Classification Search
CPC ......... G11C 29/44; G11C 29/02; G11C 29/10; G11C 29/12005; G11C 29/50004;
(Continued)

(56) References Cited

U.S. PATENT DOCUMENTS 5,896,401 A * 4/1999 Abramovici ... G01R 31/318342
714/741
8,863,050 B1 10/2014 O'Riordan et al.
(Continued)

FOREIGN PATENT DOCUMENTS

| TW | 201723899 A | 7/2017 |
| TW | 201915792 A | 4/2019 |
| TW | 202011039 A | 3/2020 |

OTHER PUBLICATIONS

Taiwan Office Action on TW Patent Appl. No. 109139855 dated Aug. 27, 2021 (4 pages).
(Continued)

*Primary Examiner* — Nghia M Doan
(74) *Attorney, Agent, or Firm* — FOLEY & LARDNER LLP

(57) ABSTRACT

A method of identifying cell-internal defects: obtaining a circuit design of an integrated circuit, the circuit design including netlists of one or more cells coupled to one another; identifying the netlist corresponding to one of the one or more cells; injecting a defect to one of a plurality of circuit elements and one or more interconnects of the cell; retrieving a first current waveform at a location of the cell where the defect is injected by applying excitations to inputs of the cell; retrieving, without the defect injected, a second current waveform at the location of the cell by applying the same excitations to the inputs of the cell; and selectively annotating, based on the first current waveform and the second current waveform, an input/output table of the cell with the defect.

20 Claims, 4 Drawing Sheets

(51) Int. Cl.

| | |
|---|---|
| *G11C 29/12* | (2006.01) |
| *G11C 29/10* | (2006.01) |
| *G11C 29/02* | (2006.01) |
| *G11C 29/50* | (2006.01) |
| *G01R 31/3185* | (2006.01) |
| *G01R 31/3183* | (2006.01) |
| *G06F 11/07* | (2006.01) |
| *G01R 31/3181* | (2006.01) |

(52) U.S. Cl.
CPC ............ *G11C 29/02* (2013.01); *G11C 29/10* (2013.01); *G11C 29/12005* (2013.01); *G11C 29/50004* (2013.01); *G01R 31/2837* (2013.01); *G01R 31/31813* (2013.01); *G06F 11/079* (2013.01)

(58) Field of Classification Search
CPC .... G01R 31/318342; G01R 31/318547; G01R 31/2837; G01R 31/31813; G01R 31/2851; G06F 11/079
See application file for complete search history.

(56) References Cited

U.S. PATENT DOCUMENTS

| | | | |
|---|---|---|---|
| 9,739,827 B1* | 8/2017 | Spinner | G01R 31/2851 |
| 2003/0146763 A1 | 8/2003 | Sunter | |
| 2004/0078175 A1 | 4/2004 | Shaw | |
| 2004/0088627 A1* | 5/2004 | Nishioka | G01R 31/318328 |
| | | | 714/E11.167 |
| 2007/0089001 A1* | 4/2007 | Hsu | G01R 31/318547 |
| | | | 714/726 |
| 2008/0111558 A1 | 5/2008 | Sharma et al. | |
| 2010/0229061 A1* | 9/2010 | Hapke | G01R 31/318342 |
| | | | 714/740 |
| 2014/0059507 A1 | 2/2014 | Sunter | |
| 2018/0060472 A1 | 3/2018 | Chen | |
| 2018/0149698 A1 | 5/2018 | Goel et al. | |
| 2018/0349521 A1 | 12/2018 | Jana et al. | |
| 2018/0364298 A1 | 12/2018 | Grosse et al. | |
| 2020/0057106 A1 | 2/2020 | Balasubramanian et al. | |

OTHER PUBLICATIONS

U.S. Notice of Allowance on U.S. Appl. No. 16/912,156 dated Feb. 24, 2022.

U.S. Office Action on U.S. Appl. No. 16/912,156 dated Dec. 27, 2021.

* cited by examiner

FIG. 5

SYSTEMS AND METHODS TO DETECT CELL-INTERNAL DEFECTS

CROSS-REFERENCE TO RELATED APPLICATION

This application is a continuation of U.S. patent application Ser. No. 16/912,156, filed on Jun. 25, 2020, which is incorporated herein by reference in its entirety.

BACKGROUND

A wide range of fault models have been used to generate test patterns for detecting faults or defects in integrated circuits, such as stuck-at, bridging, inter-cell-opens, and transition-faults among others. These fault models share the assumption that faults only occur between library cell instances such as, for example, at the ports of library cells, between the interconnect lines outside of library cells, etc. Today's automated test pattern generation (ATPG) tools apply these standard fault models with either assuming no faults within library cells, or considering only those faults inside library cells based on the gate models used by the ATPG. These gate models are useful for injecting faults at the cell ports (e.g., inputs/outputs) or at the primitive cell structures used by the ATPG (e.g., at the relatively high-level of a circuit design), but not suitable for modeling real layout-based defects inside library cells. Thus, the conventional fault detection techniques are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

To focus on cell-internal defects, some techniques have been proposed. For example, N-detect, embedded-multi-detect (EMD), and gate-exhaustive testing have shown success in detecting (or "covering") some previously un-modeled defects. However, these techniques may be too complex for real-world designs, or only improve the likelihood of detecting cell-internal defects in a probabilistic fashion rather than target the cell-internal defects in a deterministic fashion. In N-detect testing, the chance of detection is improved by targeting the same fault multiple times under different conditions. This typically increases the number of patterns by a factor of N, however, and therefore makes the test costly. The EMD-based approach increases the number of different defects that can be detected (sometimes referred to as defect "coverage") by exploiting unused bits in the existing ATPG patterns. Unlike the methods based on N-detect, no additional test patterns are needed with the EMD-based approach. Nevertheless, there exists only a probabilistic relation to actual defects for both techniques. Thus, it is difficult to quantify the additional defect coverage provided by these techniques relative to conventional techniques, and to predict the resulting benefit for future designs. While the gate-exhaustive testing method may be able to cover intra-cell defects, the method also tends to generate a very large number of additional patterns and result in high test costs.

The present disclosure provides various embodiments of a defect detection system that can detect, monitor, or otherwise identify cell-internal defects of an integrated circuit. In general, a circuit design (e.g., a netlist) of the integrated circuit can be represented by a number of cells (or standard cells) that are communicatively coupled to one another. Each of the cells can correspond to a netlist. The defect detection system, as disclosed herein, can identify one or more defects within each of the cells by comparing respective cell behaviors when the cell includes one or more faults/defects (sometimes referred to as a "faulty cell") and when the cell does not include any fault/defect (sometimes referred to as a "fault-free cell"), respectively.

In various embodiments, the defect detection system can obtain various types of waveforms of the faulty cell and the fault-free cell over a certain time-domain range by providing the cell with at least a cycle of input excitations, and then compare the same type of waveforms of the faulty cell and the fault-free cell. If identifying a large enough discrepancy in a first type of waveforms (e.g., voltage waveforms), the detection system can categorize the corresponding defect as a first type of defects corresponding to the first type of waveforms. On the other hand, if no such a large enough discrepancy is identified when comparing the waveforms in the first type, the detection system can advance to compare a second type of waveforms (e.g., current waveforms) of the faulty cell and the fault-free cell. If a large enough discrepancy is identified in the second type of waveforms, the detection system can categorize the corresponding defect as a second type of defects corresponding to the second type of waveforms. In this way, the above-identified technical issues can be resolved by using the defect detection system, as disclosed herein, to detect cell-internal defects. For example, by comparing a first type of waveforms corresponding to the faulty cell and the fault-free cell and then a second type of waveforms corresponding to the faulty cell and the fault-free cell, the defect detection system can detect the cell-internal defects in a relatively more deterministic fashion with respect to the existing cell-internal defect detection techniques. As such, the coverage and reliability in detecting cell-internal defects within a cell can be significantly improved.

Figure 1:
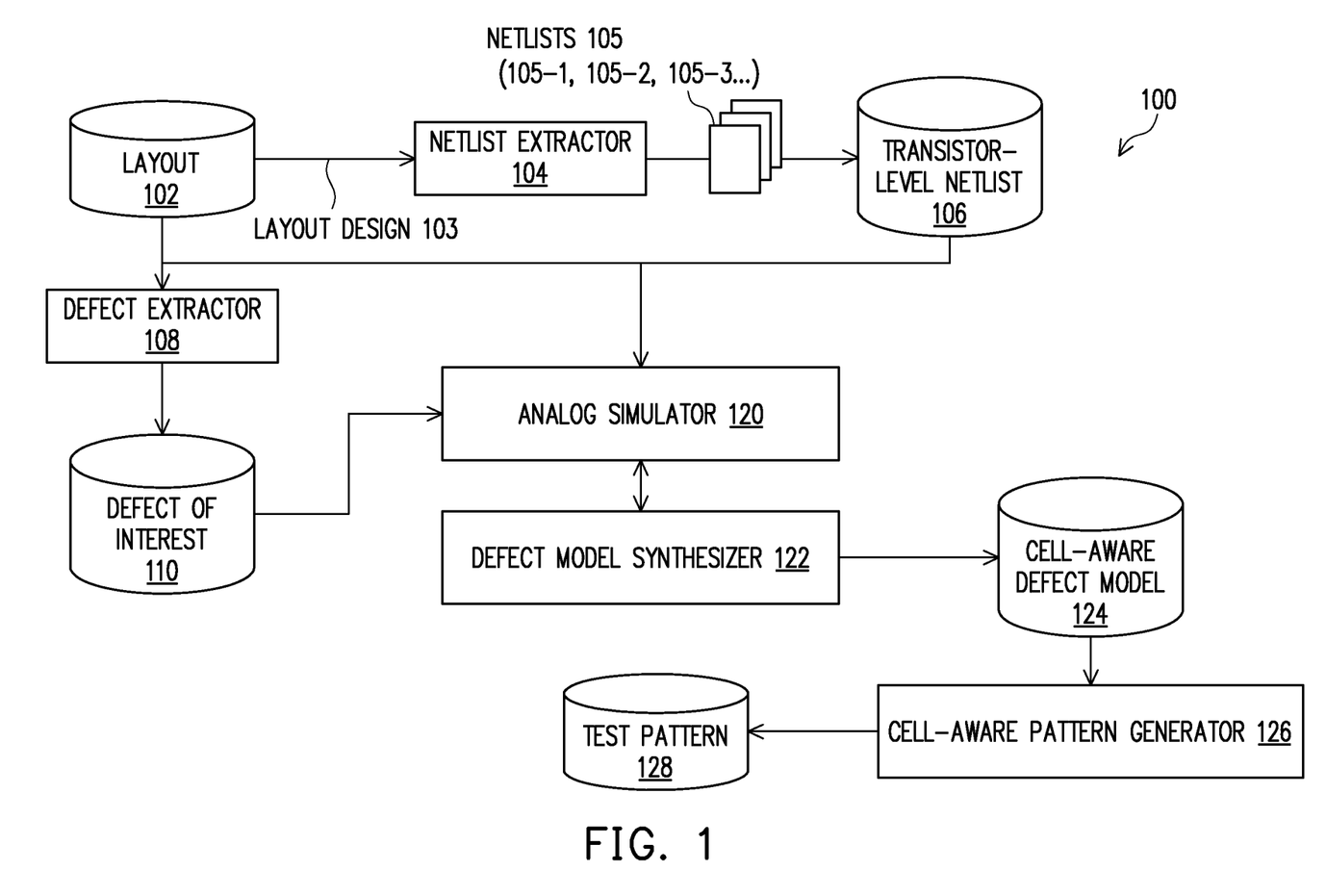
FIG. 1 illustrates an example block diagram of a defect detection system, in accordance with some embodiments.

Referring to FIG. 1, depicted is an example block diagram of a defect detection system 100 for identifying one or more defects within each of a plurality of cells (sometimes referred to as "cell-internal defects") that communicatively coupled to one another to form an integrated circuit, in accordance with various embodiments. As shown, the defect detection system 100 can include a layout database 102, a netlist extractor 104, a transistor-level netlist database 106, a defect extractor 108, a defect of interest database 110, an analog simulator 120, a defect model synthesizer 122, a cell-aware detect model database 124, a cell-aware pattern generator 126, and a test pattern database 128. It is noted that the block diagram of FIG. 1 is simplified for illustration purposes, and thus, the defect detection system 100 can include any suitable component or element to detect cell-internal defects, while remaining within the scope of the present disclosure. In some embodiments, each of the layout database 102, the netlist extractor 104, the transistor-level netlist database 106, the defect extractor 108, the defect of interest database 110, the analog simulator 120, the defect model synthesizer 122, the cell-aware detect model database 124, the cell-aware pattern generator 126, and the test pattern database 128 is communicatively coupled with or incorporated to each other to identify one or more cell-internal defects, which shall be discussed in detail below.

Each of the above-mentioned elements or entities is implemented in hardware, or a combination of hardware and software, in one or more embodiments. Each component of the defect detection system 100 may be implemented using hardware or a combination of hardware or software detailed above in connection with FIG. 5. For instance, each of the elements or entities shown in FIG. 1 can include any application, program, library, script, task, service, process or any type and form of executable instructions executing on hardware (e.g., defect model synthesizer 122). The hardware includes circuitry such as one or more processors in one or more embodiments.

The layout database 102 can store respective layout designs of a number of integrated circuits. In accordance with various embodiments, an integrated circuit can include a number of components (e.g., electronic circuits) communicatively coupled with one another to perform desired function(s). Examples of such an integrated circuit can range from a relatively simple single-function IC (e.g., of several thousand gates), to a relatively complex multi-million gate system-on-a-chip (SoC). The corresponding layout design can include a representation of the integrated circuit in terms of planar geometric shapes, which correspond to respective patterns of metal, oxide, and/or semiconductor layers, for example, that make up components of the integrated circuit. The layout design may be in any desired format, such as, for example, the Graphic Data System II (GDSII) data format or the Open Artwork System Interchange Standard (OASIS) data format proposed by Semiconductor Equipment and Materials International (SEMI). Other formats include an open source format named Open Access, Milkyway by Synopsys, Inc., and EDDM by Mentor Graphics, Inc.

In general semiconductor design, standard cell methodology is a method of designing application-specific integrated circuits (ASICs) with mostly digital-logic features. Standard cell methodology is an example of design abstraction, whereby a layout design is encapsulated in an abstract logic representation. In some embodiments, the layout design stored in the layout database 102 can include (or be represented by) one or more cells communicatively coupled with one another. Each of the cells can include a group of transistor(s) and interconnect(s) that provide a Boolean logic function (e.g., an AND logic gate, an OR logic gate, an inverter, etc.) or a storage function (a flipflop, a latch, etc.).

The netlist extractor 104 can extract, obtain, or otherwise identify a netlist (or a schematic view) of each of the cells of the layout design of an integrated circuit. The netlist can be an instance-based netlist, e.g., a transistor-level netlist, in some embodiments. The netlist extractor 104 can identify any other type of netlists (e.g., a net-based netlist) from the layout design, while remaining within the scope of the present disclosure.

The transistor-level netlist of a cell is a nodal description of circuit elements, of their connections (e.g., interconnections) to each other, and of their terminals (e.g., inputs, outputs) to the external environment (e.g., one or more other cells of the integrated circuit). In some embodiments, the netlist extractor 104 can identify the netlist of a first one of the cells by at least one of: locating one or more inputs of the first cell that are communicatively connected to at least a second one of the cells, or locating one or more outputs of the first cell that are communicatively connected to at least a third one of the cells.

The circuit elements of the identified netlist can be grouped into two categories: active circuit elements and passive circuit elements. Examples of the active circuit element can include any of various forms of transistors (e.g., a metal-oxide-semiconductor field-effect-transistor (MOSFET), a bipolar junction transistor (BJT), a high-electron-mobility transistor (HEMT), etc.). Examples of the passive circuit elements can include various forms of resistors, inductors, and/or capacitors. A schematic view may be generated with a number of different Computer Aided Design (CAD) or Electronic Design Automation (EDA) programs that provide a Graphical User Interface (GUI) for such a netlist generation process.

In various embodiments, the netlist extractor 104 can communicate or otherwise interface with the layout database 102 to obtain the layout design of an integrated circuit (e.g., 103), which includes a number of communicatively coupled cells. In response to obtaining the layout design, the netlist extractor 104 can extract a transistor-level netlist for each of the cells (e.g., 105-1, 105-2, 105-3, etc.), and store the transistor-level netlists (e.g., collectively referred to as transistor-level netlists 105) in the transistor-level netlist database 106. In some other embodiments, the transistor-level netlist database 106 may store a transistor-level netlist that is not extracted from a layout design. For example, such a transistor-level netlist may be directly or indirectly provided by a user of the defect detection system 100.

The defect extractor 108 can extract, hypothesize, or otherwise identify one or more defects of interest in each of the transistor-level netlists (e.g., 105-1) stored in the transistor-level netlist database 106. Further, the defect extractor 108 can extract or otherwise determine one or more characteristics (e.g., a location, a defective type, a value discrepant from the design-intent) of each the defects of interest relative to the components/elements in the example transistor-level netlist 105-1. As such, the defects can later be injected, inserted, incorporated, or otherwise updated into the transistor-level netlist. Various representative examples of the defects shall be discussed as follows. The below examples are provided for illustration purposes and thus, it is understood that the defect extractor 108 can extract any of various other types of defects from the example transistor-level netlist 105-1 while remaining within the scope of the present disclosure.

In some embodiments, based on the transistor-level netlists 105 retrieved from the transistor-level netlist database 106, the defect extractor 108 can identify one or more defects of interest in each of the transistor-level netlists (e.g., 105-1) by intentionally opening two of a plurality of terminals of at least one active circuit element (e.g., a transistor) included in the transistor-level netlist 105-1. For example, the defect extractor 108 can open source and gate terminals of the transistor, source and drain terminals of the transistor, and/or drain and gate terminals of the transistor, which are supposed to be electrically coupled to each other.

In some embodiments, based on the transistor-level netlists 105 retrieved from the transistor-level netlist database 106, the defect extractor 108 can identify one or more defects of interest in each of the transistor-level netlists (e.g., 105-1) by intentionally shorting two of a plurality of terminals of at least one active circuit element (e.g., a transistor) included in the transistor-level netlist 105-1. For example, the defect extractor 108 can short source and gate terminals of the transistor, source and drain terminals of the transistor, and/or drain and gate terminals of the transistor, which are supposed to be electrically isolated from each other.

In some embodiments, based on the transistor-level netlists 105 retrieved from the transistor-level netlist database 106, the defect extractor 108 can identify one or more defects of interest in each of the transistor-level netlists (e.g., 105-1) by intentionally opening an interconnect connecting two or more circuit elements included in the transistor-level netlist 105-1. For example, the defect extractor 108 can open an interconnect connecting at least two or more of: a transistor, a resistor, a capacitor, or an inductor. In another example, the defect extractor 108 can open an interconnect connecting one of the circuit elements in the transistor-level netlist 105-1 to a power supply (e.g., VDD, VSS, etc.).

In some embodiments, based on the transistor-level netlists 105 retrieved from the transistor-level netlist database 106, the defect extractor 108 can identify one or more defects of interest in each of the transistor-level netlists (e.g., 105-1) by intentionally changing the design-intent value of a passive circuit element included in the transistor-level netlist 105-1. For example, the defect extractor 108 can vary the design-value of a resistor over a certain range (e.g., substantially greater and/or lower than the design-value specified in the netlist 105-1).

In some embodiments, based on the layout design retrieved from the layout database 102, the defect extractor 108 can identify one or more defects of interest in each of the transistor-level netlists 105 as parasitic features associated with a collection of geometric elements or location data for geometric elements in the layout design. Further, as the netlist extractor 104 can produce the transistor-level netlist (e.g., 105-1) from the layout design, by interfacing with the transistor-level netlist database 106, the defect extractor 108 can correlate the components in the netlist with the geometric elements in the layout design.

Upon identifying one or more defects in each of the netlists 105, the defect extractor 108 can store the identified defects in the defect of interest database 110, in some embodiments. The defect extractor 108 can store the characteristic(s) (e.g., a location, a defective type, a value discrepant from the design-intent) of each of the identified defects in the defect of interest database 110. For example, in response to identifying a defect as an open circuit across an interconnect connecting two circuit elements of the netlist 105-1, the defect extractor 108 can store, in the defect of interest database 110, where the defect can be occurred. In some other embodiments, the defect extractor 108 can directly communicate or otherwise interface with the analog simulator 120 to provide such characteristic(s) of each of the identified defects for comparing the cell behaviors of each of the cells as a faulty cell and a fault-free cell, respectively, which shall be discussed as follows.

The analog simulator 120 can simulate, calculate, or otherwise obtain the cell behaviors of each of the cells of the layout design 103 as a faulty cell and a fault-free cell, respectively, in accordance with various embodiments of the present disclosure. By interfacing with the transistor-level netlist database 106, the analog simulator 120 can obtain a netlist (e.g., 105-1) of each of the cells of the layout design 103. Based on the netlist, the analog simulator 120 can obtain a cell behavior of the cell using a circuit simulator (e.g., Simulation Program with Integrated Circuit Emphasis (SPICE)). In some embodiments, the cell behavior of a cell that is simulated purely based on the design-intent parameters of a corresponding netlist (e.g., without defects injected) can sometimes be referred to as the behavior of a fault-free cell.

When obtaining the fault-free cell behavior, the analog simulator 120 can present, output, or otherwise provide the fault-free cell behavior in various ways. For example, the analog simulator 120 can present the fault-free cell behavior as one or more voltage waveforms over a certain time range at the output(s) of the cell (netlist). The time range may expand over a cycle in which each of all the possible excitations is applied to the input(s) of the cell (netlist) once, e.g., a combination of logic states respectively applied to the inputs of the cell. The time range may expand over a plurality of such cycles, while remaining within the scope of the present disclosure. In one embodiment, each of the logic states may be applied as a static value (e.g., a stable logic high or low). In another embodiment, each of the logic states may be applied as a transitionary value (e.g., a transition from logic high to low, or vice versa). In yet another embodiment, some of the logic states may be each applied as a static value, while some of the logic states may be each applied as a transitionary value. In another example, the analog simulator 120 can present the fault-free cell behavior as one or more current waveforms over the same time range at respective locations of the cell (netlist) where the one or more defects are to be injected, which shall be discussed below. In some embodiments, the analog simulator 120 can, alternatively or additionally, present the fault-free cell behavior as one or more current waveforms over the same time range at respective locations of the cell (netlist) where one or more power supplies are connected.

By interfacing with the defect of interest database 110, the analog simulator 120 can obtain the characteristics of one or more defects of interest associated with each of the netlists (e.g., 105-1). Based on respective characteristic of the defects of interest associated with the netlist, the analog simulator 120 can inject, insert, or otherwise incorporate the defects of interest into the netlist, and obtain a cell behavior of the cell using a circuit simulator (e.g., Simulation Program with Integrated Circuit Emphasis (SPICE)). In some embodiments, the cell behavior of a cell that is simulated based on a corresponding netlist with the defect injected can sometimes be referred to as the behavior of a faulty cell.

When obtaining the faulty cell behavior by injecting the defect, the analog simulator 120 can present, output, or otherwise provide the faulty cell behavior in one or more ways. For example, the analog simulator 120 can present the faulty cell behavior as one or more voltage waveforms over the same time range at the output(s) of the cell (netlist). In another example, the analog simulator 120 can present the faulty cell behavior as one or more current waveforms over the same time range at the respective locations of the cell (netlist) where the one or more defects were injected. In some embodiments, the analog simulator 120 can, alternatively or additionally, present the faulty cell behavior as one or more current waveforms over the same time range at the respective locations of the cell (netlist) where one or more power supplies are connected.

The defect model synthesizer 122 can annotate, update, or otherwise generate, based on comparing the fault-free cell behavior and the faulty cell behavior of a cell, an input/output table of the cell using one or more defects. Examples of such an input/output table can include a static or transitionary truth table of the cell in connection with Boolean algebra, which can later be updated (annotated) as a cell test model (CTM). In general, the truth table includes a first column representing all of the possible combinations of the input logic states, and a second column representing all of the possible output logic states that the cell can provide. Each row of the truth table contains one possible combination of the input logic states (static logic states, transitionary logic states, or a combination thereof), and the output logic state corresponding to those input logic states.

To annotate the truth table, the defect model synthesizer 122 can interface with the analog simulator 120 to determine which of the rows of the truth table shall be annotated with a defect. For example, in response to the analog simulator 120 obtaining the voltage and current waveforms of a cell with and without one of the defects injected, the defect model synthesizer 122 can interface with the analog simulator 120 to first compare the voltage waveforms of the cell (with and without one of the defects injected). If determining that a difference between these two voltage waveforms satisfies a voltage threshold (e.g., greater than the voltage threshold), the defect model synthesizer 122 can identify a timestamp corresponding to the occurrence of such a difference. The defect model synthesizer 122 can determine which of the combinations of the input logic states (which row in the truth table) corresponds to the timestamp such that the defect model synthesizer 122 can annotate the row with this defect. On the other hand, if determining that the difference between these two voltage waveforms does not satisfy the voltage threshold (e.g., less than the voltage threshold), the defect model synthesizer 122 can further compare the current waveforms of the cell (with and without one of the defects injected). If determining that a difference between these two current waveforms satisfies a current threshold (e.g., greater than the current threshold), the defect model synthesizer 122 can identify a timestamp corresponding to the occurrence of such a difference. The defect model synthesizer 122 can determine which of the combinations of the input logic states (which row in the truth table) corresponds to the timestamp such that the defect model synthesizer 122 can annotate the row with this defect. On the other hand, if determining that the difference between these two current waveforms does not satisfy the current threshold (e.g., less than the current threshold), the defect model synthesizer 122 can iteratively perform similar operations to determine whether to annotate the truth table with each of the remaining defects.

The defect model synthesizer 122 can store the annotated truth table for each of the cells in the cell-aware defect model database 124. The cell-aware pattern generator 126 can then use the annotated truth tables to generate test patterns for the respective cells. The cell-aware pattern generator 126 can store the test patterns in the test pattern database 128. Various cell-aware ATPG (CA-ATPG) tools, known in the art, may be used to generate the test patterns. As such, the corresponding description shall be omitted.

Figure 2:
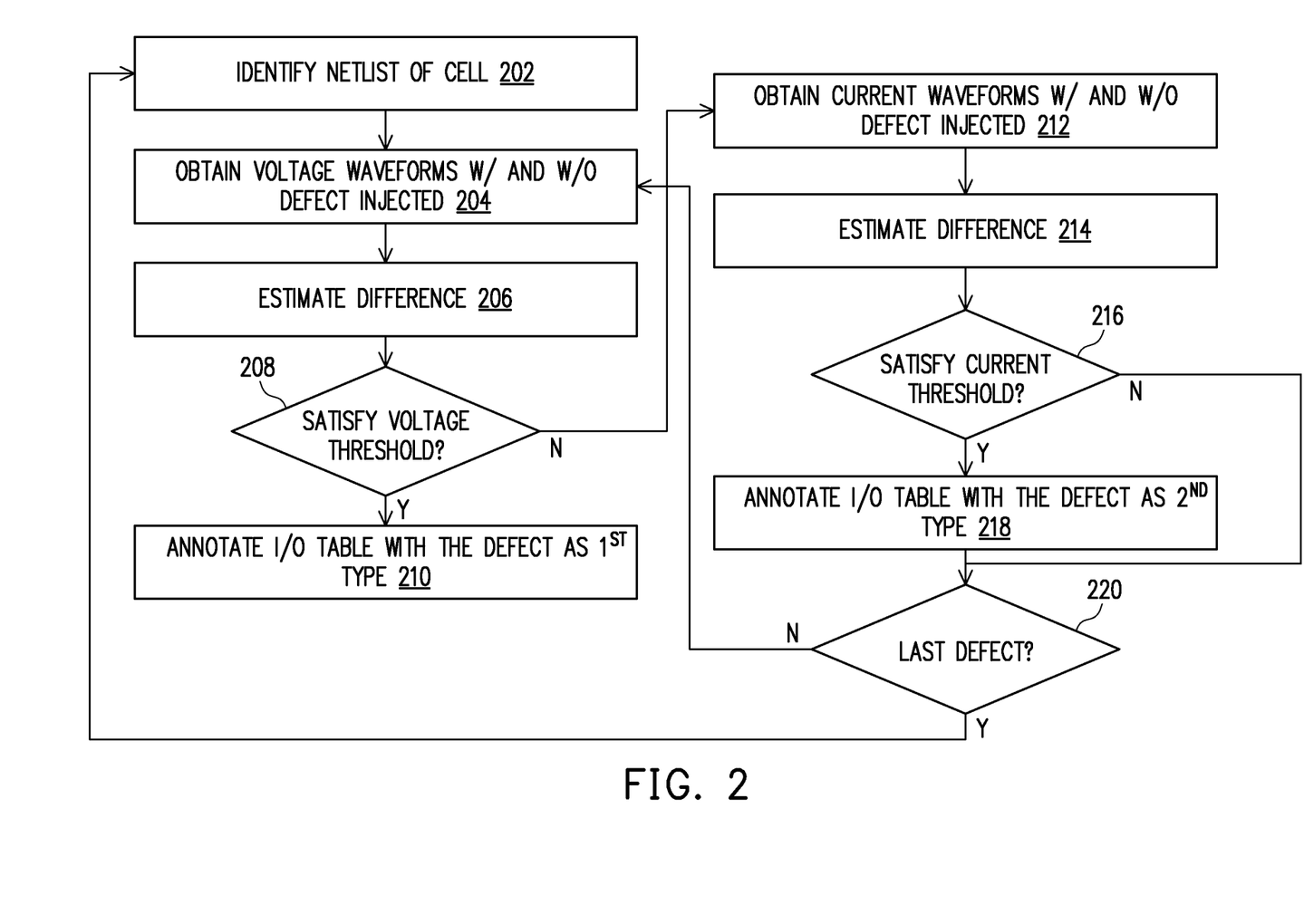
FIG. 2 illustrates a flow chart of a method for detecting cell-internal defect(s), in accordance with some embodiments.

Referring to FIG. 2, depicted is a flow diagram of a method 200 for detecting defect(s) within a cell. The operations of the method 200 can be implemented using, or performed by, one or more of the components detailed herein in connection with FIG. 1. Accordingly, the following discussion of FIG. 2 shall be conducted in conjunction with FIG. 1. The illustrated embodiment of the method 200 is merely an example. Therefore, it is understood that any of a variety of operations may be omitted, re-sequenced, and/or added while remaining within the scope of the present disclosure.

In brief overview, a defect detection system can identify a netlist of a cell at operation 202. At operation 204, the defect detection system can obtain voltage waveforms of the cell with and without a defect injected, respectively. At operation 206, the defect detection system can estimate a difference between the voltage waveforms. At operation 208, the defect detection system can determine whether the difference satisfies a voltage threshold. If so, the defect detection system can annotate an input/output table of the cell with the defect as a first type at operation 210. If not, the defect detection system can then obtain current waveforms of the cell with and without a defect injected, respectively, at operation 212. Next, the defect detection system can estimate a difference between the current waveforms at operation 214. At operation 216, the defect detection system can determine whether the difference satisfies a current threshold. If so, the defect detection system can annotate the input/output table of the cell with the defect as a second type at operation 218. If not, at operation 220, the defect detection system can determine whether the defect is the last defect. If not, the method 200 can proceed again to operation 204 to detect a next defect of the cell. On the other hand, if so, the method 200 can proceed again to operation 202 to detect defect(s) within a next cell.

Still referring to FIG. 2, and in further detail, a defect detection system (e.g., 100 in FIG. 1) can identify a netlist of a first one of a number of cells that represent an integrated circuit at operation 202. The netlist can be a transistor-level netlist, for example. In some embodiments, the defect detection system 100 can identify the netlist of the first cell by at least one of: locating one or more inputs of the first cell that are communicatively connected to at least a second one of the cells, or locating one or more outputs of the first cell that are communicatively connected to at least a third one of the cells.

Figure 3:
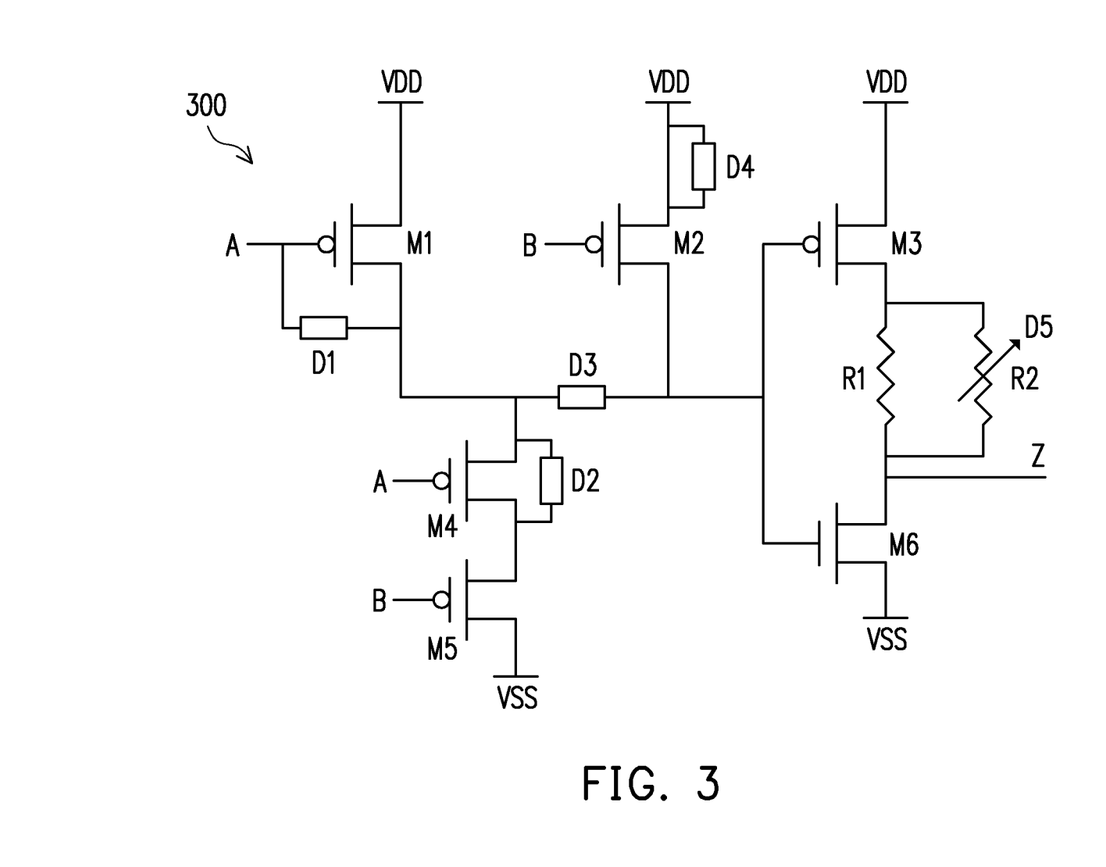
FIG. 3 illustrates a schematic view of a transistor-level netlist of an example cell to be examined by the defect detection system of FIG. 1, in accordance with some embodiments.

Referring to FIG. 3, a schematic view of a transistor-level netlist of a cell 300 is shown. It is noted that the cell 300 is merely provided as an example for illustration purposes and thus, the cell 300 shall be briefly described as follows. As shown in FIG. 3, the cell 300 includes inputs: "A" and "B;" and an output "Z." The defect detection system 100 can identify the cell 300 from a number of cells of an integrated circuit by locating the inputs A and B connected to one or more other cells or one or more input signal lines, and locating the output Z connected to one or more other cells or one or more output signal lines. In the example netlist shown in FIG. 3, the cell 300 includes six transistors: M1, M2, M3, M4, M5, and M6 and two resistors: R1 and R2. It shall be understood that the cell 300 can include any of various other circuit components and any desired number of the transistors and resistors, while remaining within the scope of present disclosure.

For example in FIG. 3, The transistors M1-M3 each includes a p-type MOSFET and the transistors M4-M6 each includes an n-type MOSFET, while each of the transistors M1-M6 can include any of other types of transistors. Specifically, respective gates of the transistors M1 and M4 are configured as (or connected to) the input A. Respective gates of the transistors M2 and M5 are configured as (or connected to) the input B. One of the terminals of the resistor R1, one of the terminals of the resistor R2, and a drain of the transistor M6 are configured as (or connected to) the output Z. Further, each of the circuit elements, transistors M1-M6 and resistors R1-R2, is connected to one or more other circuit elements or power supplies through respective interconnect. For example, a source of the transistor M1, a source of the transistor M2, and a source of the transistor M3 are each connected to VDD, while respective drains of the transistors M1-M3 are each connected to at least another transistor through an interconnect. In another example, a source of the transistor M5 and a source of the transistor M6 are each connected to VSS, while respective drains of the transistors M5-M6 are each connected to at least another transistor through an interconnect.

In response to obtaining the netlist of the cell 300, the defect detection system 100 can identify one or more possible defects to be injected based on the netlist and/or a corresponding layout design from which the netlist of the cell 300 is extracted. For example in FIG. 3, a number of possible defects are illustrated. The defects shown in FIG. 3 are merely provided as examples for illustration purposes. Thus, it is appreciated that the cell 300 can include any of various other types of defects while remaining within the scope of the present disclosure. As shown, the defect detection system 100 can identify the following example defects (and corresponding characteristics(s)) in the cell 300: a first defect, $D_1$, that shorts gate and drain of the transistor M1, which are supposed to be electrically isolated from each other; a second defect, $D_2$, that shorts drain and source of the transistor M4, which are supposed to be electrically isolated from each other; a third defect, $D_3$, that opens an interconnect, which is supposed to electrically connect respective drains of the transistors M1-M2; a fourth defect, $D_4$, that is parasitically coupled to an interconnect electrically connecting source of the transistor M2 an VDD; and a fifth defect, $D_5$, that corresponds to a value of the resistor R2 offset from the design-intent value specified by the netlist.

Upon identifying the possible defects (and corresponding characteristic(s)) of the cell 300, the defect detection system 100 can inject, into the netlist of the cell 300, the defects one-by-one based on the respective characteristic(s) and obtain voltage waveforms of the cell 300 with and without the defect injected, respectively (operation 204). Based on the netlist of the cell 300, the defect detection system 100 can use a circuit simulator (e.g., SPICE) to obtain a first voltage waveform at the output Z of the cell 300 without injecting any defect into the netlist. In some embodiments, the defect detection system 100 can obtain the first voltage waveform by exciting the cell 300 with at least a cycle of all possible combinations of the input logic states (through SPICE).

For instance, through SPICE, the defect detection system 100 can sequentially excite the inputs A and B with respective static logic states: 00, 01, 10, and 11, which can cause the cell 300 to generate the corresponding first voltage waveform at the output Z. In another example, the defect detection system 100 can sequentially excite the inputs A and B with respective static and/or transitionary logic states: 0R, 0F, F1, and FR ("R" corresponding to a rising edge transitioning from logic low to high; and "F" corresponding to a falling edge transitioning from logic high to low), which can cause the cell 300 to generate the corresponding first voltage waveform at the output Z. Then, based on the identified defects (and corresponding characteristic(s)), the defect detection system 100 can inject one of the defects (e.g., defect $D_1$) into the netlist of the cell 300. In accordance with the characteristics(s) of defect $D_1$ identified as a short circuit across the gate and drain of the transistor M1, the defect detection system 100 can inject such a defect with the corresponding defect type (a short circuit) into the corresponding location within the cell (netlist). Upon injecting defect $D_1$ into the netlist of the cell 300, the defect detection system 100 can obtain a second voltage waveform at the output Z of the cell 300 using the same excitations through SPICE, for example.

In response to obtaining the first and second voltage waveforms, the defect detection system 100 can compare the first voltage waveform and the second voltage waveform to estimate a difference presented therebetween (operation 206). In some embodiments, to estimate the difference presented between the first voltage waveform and the second voltage waveform, the defect detection system 100 can overlap the first voltage waveform and the second voltage waveform by aligning the time-domain of these two voltage waveforms. By exciting inputs A and B of the cell 300 with one cycle of four logic states (00, 01, 10, and 11), the first and second voltage waveforms may each include four corresponding voltage values present at the output Z. The defect detection system 100 can compare the respective voltage values of the first and second voltage waveforms that correspond to the same time-domain parameter (e.g., a timestamp). Specifically, the defect detection system 100 can estimate the voltage difference between the voltage values of the first and second voltage waveforms, corresponding to each of the four logic states (00, 01, 10, and 11).

In response to estimating the voltage differences, the defect detection system 100 can determine whether any of the voltage differences satisfies a voltage threshold (operation 208). In some embodiments, the defect detection system 100 can compare each of the voltage differences with the voltage threshold. Based on the comparison, if the voltage difference is greater than or equal to the voltage threshold, the defect detection system 100 can annotate an input/output table of the cell 300 with the corresponding defect (operation 210); and if the voltage difference is less than the voltage threshold, the defect detection system 100 can obtain current waveforms of the cell 300 with and without the defect injected, respectively (operation 212).

Figure 4:
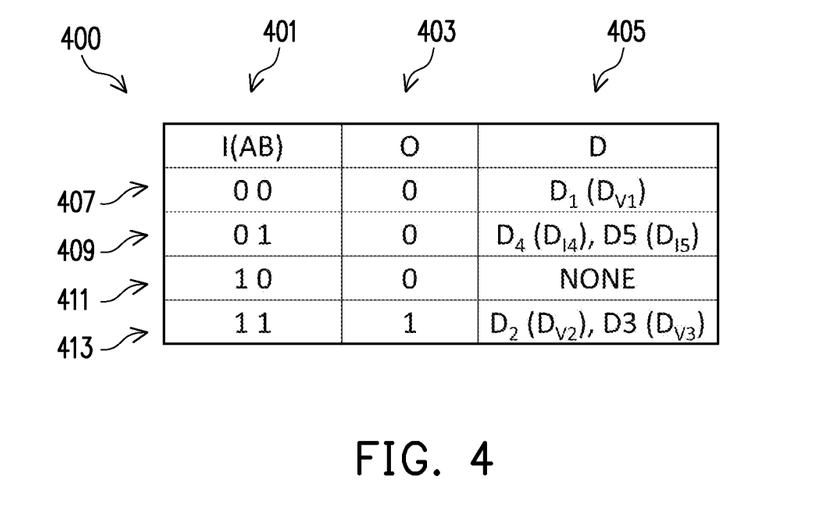
FIG. 4 illustrates an example input/output table of a cell to be annotated by the defect detection system of FIG. 1, in accordance with some embodiments.

FIG. 4 depicts an example input/output table 400 of the cell 300 to be annotated by the defect detection system 100. As shown, the input/output table 400 includes columns 401, 403, and 405, and rows 407, 409, 411, and 413. The column 401 corresponds to all the possible input logic states with which the cell 300 is excited; the column 403 corresponds to all the possible output logic states that the cell 300 can provide; and the column 405 corresponds to all the defects that the defect detection system 100 determines to insert into the input/output table 400. The row 407 corresponds to one possible combination of the input logic states (e.g., 00), the output logic state corresponding to those input logic states (e.g., 0), and one or more selectively inserted defects; the row 409 corresponds to one possible combination of the input logic states (e.g., 01), the output logic state corresponding to those input logic states (e.g., 0), and one or more selectively inserted defects; the row 411 corresponds to one possible combination of the input logic states (e.g., 10), the output logic state corresponding to those input logic states (e.g., 0), and one or more selectively inserted defects; and the row 413 corresponds to one possible combination of the input logic states (e.g., 11), the output logic state corresponding to those input logic states (e.g., 1), and one or more selectively inserted defects.

Using the above example where defect $D_1$ is being detected (examined), the defect detection system 100 can obtain the voltage waveform at the output Z (FIG. 3) without injecting defect $D_1$ and the voltage waveform at the output Z with injecting defect $D_1$ by respectively exciting the cell 300 with at least one cycle of the combinations of the input logic states (00, 01, 10, and 11). The defect detection system 100 then compares the voltage difference between the two voltage waveforms at respective timestamps that correspond to the four combinations of the input logic states (00, 01, 10, and 11). Based on the comparison, the defect detection system 100 can determine whether any of the combinations of input logic states can correspond to (or indirectly cause) a voltage difference that satisfies the voltage threshold. For instance, in response to identifying that a great enough voltage difference exists when applying the combination of input logic state (00), the defect detection system 100 can annotate the input/output table 400 by inserting defect $D_1$ into an intersection of the column 405 and row 407, as shown in the example of FIG. 4. In some embodiments, as defect $D_1$ is identified (or detected) by comparing the voltage waveforms, the defect detection system 100 may further annotate the input/output table 400 by labeling defect $D_1$ as $D_{V1}$. Following the similar procedures, the defect detection system 100 can annotate the input/output table 400 by inserting defect $D_2$ ($D_{V2}$) and defect $D_3$ ($D_{V3}$) into an intersection of the column 405 and row 413, as shown in the example of FIG. 4.

Referring again to the method 200 of FIG. 2, in response to determining that none of the voltage differences satisfies the voltage threshold, the defect detection system 100 can obtain current waveforms of the cell 300 with and without the defect injected, respectively (operation 212). Different from obtaining the voltage waveforms at the output Z of the cell 300, the defect detection system 100 can obtain a first current waveform at the location where the defect is to be injected to the cell 300 by using a circuit simulator (e.g., SPICE) on the netlist of the cell 300 without any defect injected. The defect detection system 100 can obtain the first current waveform by exciting the cell 300 with the combinations of the input logic states same as being used to obtain the voltage waveforms (through SPICE). The defect detection system 100 can then obtain a second current waveform at the location where the defect is injected to the cell 300 by using a circuit simulator (e.g., SPICE) on the netlist of the cell 300 with the defect injected. The defect detection system 100 can obtain the second current waveform by exciting the cell 300 with the combinations of the input logic states same as being used to obtain the voltage waveforms (through SPICE).

In response to obtaining the first and second current waveforms, the defect detection system 100 can compare the first current waveform with the second current waveform to estimate a difference presented therebetween (operation 214). In some embodiments, the defect detection system 100 can overlap the first current waveform and the second current waveform by aligning the time-domain of these two current waveforms. By exciting inputs A and B of the cell 300 with one cycle of four logic states (00, 01, 10, and 11), the first and second current waveforms may each include four corresponding current values present at the location where each of the defects is (to be) injected. The defect detection system 100 can compare the respective current values of the first and second current waveforms. Specifically, the defect detection system 100 can estimate the current difference between the current values of the first and second voltage waveforms, corresponding to each of the four logic states (00, 01, 10, and 11).

In response to estimating the current differences, the defect detection system 100 can determine whether any of the current differences satisfies a current threshold (operation 216). In some embodiments, the defect detection system 100 can compare each of the current differences with the current threshold. Based on the comparison, if the current difference is greater than or equal to the current threshold, the defect detection system 100 can annotate the input/output table of the cell 300 (e.g., 400 shown in FIG. 4) with the corresponding defect (operation 218); and if the current difference is less than the current threshold, the defect detection system 100 can determine whether the defect being currently examined is the last one of all the possible defects of the cell 300 (operation 220). If so, the defect detection system 100 can detect the cell-internal defects of a next cell (e.g., by proceeding again to operation 202); and if not, the detect detection system 100 can examine a next defect of the current cell (e.g., by proceeding again to operation 204). As such, the defect detection system 100 can iteratively perform at least some of the operations of the method 200 (e.g., from operation 204, through operations 206, 208, 212, 214, 218, and 220, and back to operation 204), in accordance with various embodiments.

In an example where defect $D_5$ is being detected (or examined), responsive to determining that defect $D_5$ does not cause any of the voltage differences greater than or equal to the voltage threshold (operation 208 of FIG. 2), the defect detection system 100 can obtain a first current waveform at the location where defect $D_5$ is to be injected (without defect $D_5$ actually being injected to the netlist of cell 300), and a second current waveform at the same location with defect $D_5$ actually injected into the netlist. In the example cell 300 of FIG. 3, the defect detection system 100 can obtain such two current waveforms at either one of the two terminals of the resistor R2 by exciting inputs A and B of the cell 300 with at least one cycle of four logic states (00, 01, 10, and 11). In some embodiments, as defect $D_5$ is identified (or detected) by comparing the current waveforms, the defect detection system 100 may further annotate the input/output table 400 by labeling defect $D_5$ as $D_{I5}$. Following the similar procedures, the defect detection system 100 can annotate the input/output table 400 by inserting defect $D_4$ ($D_{I4}$) into the intersection of the column 405 and row 409, as shown in the example of FIG. 4.

Figure 5:
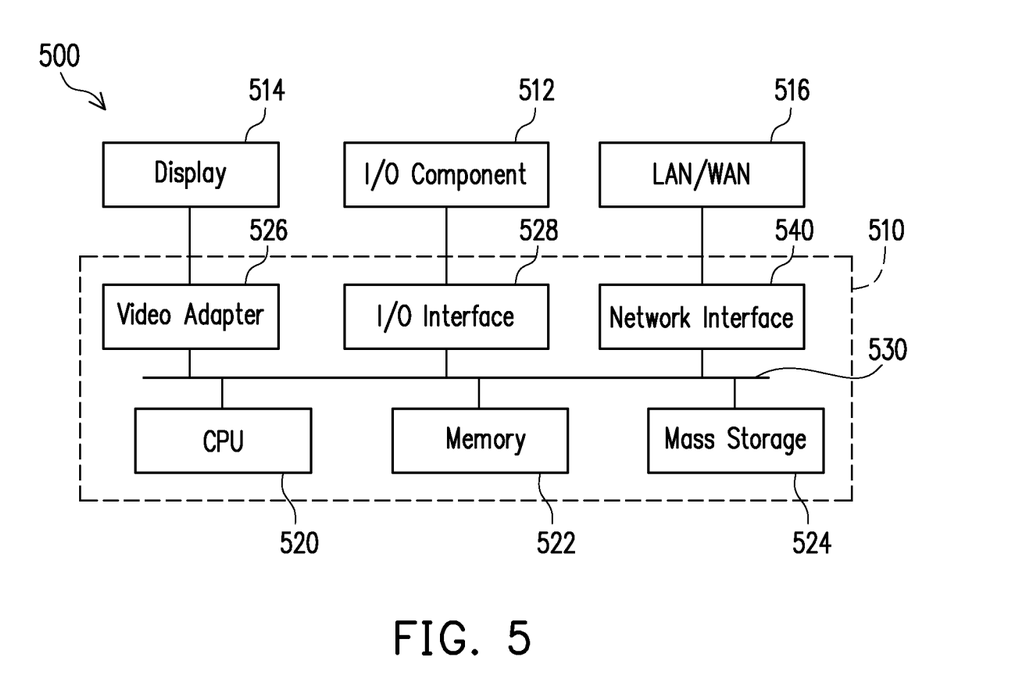
FIG. 5 illustrates a block diagram of an example information handling system (IHS), in accordance with some embodiments.

Referring now to FIG. 5, a block diagram of an information handling system (IHS) 500 is provided, in accordance with some embodiments of the present invention. The IHS 500 may be a computer platform used to implement any or all of the processes discussed herein to design an integrated circuit. The IHS 500 may comprise a processing unit 510, such as a desktop computer, a workstation, a laptop computer, or a dedicated unit customized for a particular application. The IHS 500 may be equipped with a display 514 and one or more input/output (I/O) components 512, such as a mouse, a keyboard, or printer. The processing unit 510 may include a central processing unit (CPU) 520, memory 522, a mass storage device 524, a video adapter 526, and an I/O interface 528 connected to a bus 530.

The bus 530 may be one or more of any type of several bus architectures including a memory bus or memory controller, a peripheral bus, or video bus. The CPU 520 may comprise any type of electronic data processor, and the memory 522 may comprise any type of system memory, such as static random access memory (SRAM), dynamic random access memory (DRAM), or read-only memory (ROM).

The mass storage device 524 may comprise any type of storage device configured to store data, programs, and other information and to make the data, programs, and other information accessible via the bus 530. The mass storage device 524 may comprise, for example, one or more of a hard disk drive, a magnetic disk drive, an optical disk drive, or the like.

The video adapter 526 and the I/O interface 528 provide interfaces to couple external input and output devices to the processing unit 510. As illustrated in FIG. 5, examples of input and output devices include the display 514 coupled to the video adapter 526 and the I/O components 512, such as a mouse, keyboard, printer, and the like, coupled to the I/O interface 528. Other devices may be coupled to the processing unit 510, and additional or fewer interface cards may be utilized. For example, a serial interface card (not shown) may be used to provide a serial interface for a printer. The processing unit 510 also may include a network interface 540 that may be a wired link to a local area network (LAN) or a wide area network (WAN) 516 and/or a wireless link.

It should be noted that the IHS 500 may include other components/devices. For example, the IHS 500 may include power supplies, cables, a motherboard, removable storage media, cases, and the like. These other components/devices, although not shown, are considered part of the IHS 500.

In one aspect of the present disclosure, a method of identifying defects of an integrated circuit is provided. The method includes obtaining a circuit design of an integrated circuit, the circuit design including respective netlists of one or more cells communicatively coupled to one another. The method includes identifying the netlist corresponding to one of the one or more cells, the cell including one or more inputs, one or more outputs, and a plurality of circuit elements communicatively coupled to one another via one or more respective interconnects within the cell. The method includes injecting a defect to one of the plurality of circuit elements and the one or more interconnects. The method includes retrieving a first current waveform at a location of the cell where the defect is injected by applying a plurality of excitations to the one or more inputs of the cell. The method includes retrieving, without the defect injected, a second current waveform at the location of the cell by applying the same excitations to the one or more inputs of the cell. The method includes selectively annotating, based on the first current waveform and the second current waveform, an input/output table of the cell with the defect.

In another aspect of the present disclosure, a system to identify defects of an integrated circuit is provided. The system includes one or more processors. The one or more processors are configured to identify a netlist corresponding to a cell of a plurality of cells communicatively coupled to each other to form an integrated circuit. The one or more processors are configured to inject a defect to a location within the cell. The one or more processors are configured to retrieve a first voltage waveform at one or more outputs of the cell with the defect injected by applying a plurality of excitations to one or more inputs of the cell. The one or more processors are configured to retrieve a second voltage waveform at the one or more outputs of the cell without the defect injected by applying the same excitations to the one or more inputs of the cell.

The one or more processors are configured to compare the first voltage waveform and the second voltage waveform. The one or more processors are configured to annotate, in response to determining that a difference between the first voltage waveform and the second voltage waveform satisfies a first threshold, an input/output table of the cell with the defect in a first type. The one or more processors are configured to retrieve, in response to determining that the difference between the first voltage waveform and the second voltage waveform does not satisfy the first threshold, with the defect injected, a first current waveform at the location within the cell by applying the same excitations to the one or more inputs of the cell. The one or more processors are configured to retrieve, without the defect injected, a second current waveform at the location within the cell by applying the same excitations to the one or more inputs of the cell. The one or more processors are configured to annotate, in response to determining that a difference between the first current waveform and the second current waveform satisfies a second threshold, the input/output table of the cell with the defect in a second type.

In yet another aspect of the present disclosure, a computer readable storage medium having instructions stored thereon which, when executed by a computer, cause the computer to execute a method. The method includes identifying a netlist corresponding to a cell of a plurality of cells communicatively coupled to each other to form an integrated circuit. The method includes identifying, from the netlist, one or more inputs of the cell, one or more outputs of the cell, and a plurality of circuit elements communicatively coupled to each another via one or more respective interconnects within the cell. The method includes injecting a defect to one of the plurality of circuit elements and the one or more interconnects. The method includes simulating the cell with the defect injected to retrieve a first current waveform at a location within the cell where the defect was injected. The method includes simulating the cell without the defect injected to retrieve a second current waveform at the location within the cell where the defect was injected. The method includes selectively annotating, based on comparing the first current waveform with the second current waveform, an input/output table of the cell with the defect in a current type.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of identifying defects of an integrated circuit, comprising:
retrieving, a first waveform from a cell of a circuit design for the integrated circuit responsive to applying an excitation to an input of the cell;
injecting a defect into the cell;
retrieving, with the defect injected, a second waveform from the cell responsive to applying the excitation to the input of the cell, the first waveform and the second waveform corresponding to a first type of defect;
upon a comparison of the first waveform and the second waveform not satisfying a first threshold:
retrieving, with the defect injected, a third waveform from the cell responsive to applying the excitation to the input of the cell;
retrieving, without the defect injected, a fourth waveform for the cell responsive to applying the excitation to the input of the cell, the third waveform and the fourth waveform corresponding to a second type of defect; and
annotating, responsive to a comparison of the third waveform and the fourth waveform satisfying a second threshold, an input/output table of the cell with an indication of the second type of defect.

2. The method of claim 1, wherein the first and second waveforms each comprise a voltage waveform, and the third and fourth waveforms each comprise a current waveform.

3. The method of claim 1, further comprising:
injecting a second defect to the cell of the circuit design;
retrieving, with the second defect injected, a fifth waveform from the cell responsive to applying a second excitation to the input of the cell;
retrieving, without the second defect injected, a sixth waveform from the cell responsive to applying the excitation to the input of the cell, the fifth waveform and the sixth waveform corresponding to the first type of defect;
determining that a difference between the fifth waveform and the sixth waveform satisfies a third threshold; and
identifying the second defect as the first type of defect responsive to the difference satisfying the third threshold.

4. The method of claim 1, further comprising:
determining that the comparison of the first waveform and the second waveform does not satisfy the first threshold responsive to a difference between the first waveform and the second waveform not satisfying the first threshold.

5. The method of claim 4, further comprising:
determining that a second difference between the third waveform and the fourth waveform satisfies the second threshold; and
identifying the defect as the second type of defect responsive to the second difference satisfying the second threshold.

6. The method of claim 1, wherein the cell includes a plurality of inputs, one or more outputs, and a plurality of circuit elements communicatively coupled to one another via one or more respective interconnects within the cell.

7. The method of claim 6, comprising:
retrieving the first waveform at the one or more outputs of the cell responsive to applying a plurality of excitations to the plurality of inputs of the cell; and
retrieving the second waveform at the one or more outputs of the cell responsive to applying the plurality of excitations to the plurality of inputs of the cell.

8. The method of claim 6, comprising:
retrieving the third waveform at a location of the cell where the defect is injected responsive to applying a plurality of excitations to the plurality of inputs of the cell; and
retrieving the fourth waveform at the location of the cell where the defect is injected responsive to applying the plurality of excitations to the plurality of inputs of the cell.

9. The method of claim 6, wherein injecting the defect comprises shorting two of a plurality of terminals of at least one of the plurality of circuit elements.

10. The method of claim 6, wherein injecting the defect comprises opening two of a plurality of terminals of at least one of the plurality of circuit elements.

11. The method of claim 6, wherein injecting the defect comprises varying a design-intent value of at least one of the plurality of circuit elements over a certain range.

12. A system to identify defects of an integrated circuit, comprising one or more processors, the one or more processors configured to:
retrieve a first voltage waveform from a cell of a circuit design for the integrated circuit responsive to applying an excitation to an input of the cell;
inject a defect into the cell;
retrieve with the defect injected, a second voltage waveform from the cell responsive to applying the excitation to the input of the cell;
upon a comparison of the first voltage waveform and the second voltage waveform not satisfying a first threshold corresponding to a first type of defect:
retrieve, with the defect injected, a first current waveform from the cell responsive to applying the excitation to the input of the cell;
retrieve, without the defect injected, a second current waveform from the cell responsive to applying the excitation to the input of the cell; and
annotate, responsive to a comparison of the first current waveform and the second current waveform satisfying a second threshold, an input/output table of the cell with an indication of a second type of defect.

13. The system of claim 12, wherein the one or more processors are further configured to retrieve each of the first voltage waveform and the second voltage waveform at one or more outputs of the cell responsive to applying a plurality of excitations to a plurality of inputs of the cell.

14. The system of claim 12, wherein the one or more processors are further configured to retrieve each of the first current waveform and the second current waveform at a location of the cell where the defect is injected responsive to applying a plurality excitations to one or more inputs of the cell.

15. The system of claim 12, wherein the one or more processors are further configured to retrieve each of the first current waveform and the second current waveform at a location where the cell receives a power supply.

16. The system of claim 12, wherein the one or more processors are further configured to inject the defect by shorting two of a plurality of terminals of at least one active circuit element of the cell.

17. The system of claim 12, wherein the one or more processors are further configured to inject the defect by opening two of a plurality of terminals of at least one active circuit element of the cell.

18. The system of claim 12, wherein the one or more processors are further configured to inject the defect by varying a design-intent value of at least one passive circuit element of the cell over a certain range.

19. A non-transitory computer-readable storage medium having instructions stored thereon which, when executed by a computer, cause the computer to execute a method, the method comprising:
- identifying a netlist corresponding to a cell of an integrated circuit;
- injecting a defect to the cell;
- simulating the cell with the defect injected to retrieve a first voltage waveform at an output of the cell;
- simulating the cell without the defect injected to retrieve a second voltage waveform at the output of the cell;
- upon determining that a difference between the first voltage waveform with the second voltage waveform does not exceed a predefined voltage threshold;
  - simulating the cell with the defect injected to retrieve a first current waveform at a location within the cell where the defect is injected;
  - simulating the cell without the defect injected to retrieve a second current waveform at the location within the cell where the defect is injected; and
  - annotating, responsive to determining that a difference between the first current waveform with the second current waveform exceeds a predefined current threshold, an input/output table of the cell with an indication that the defect is detectable based on current.

20. The non-transitory computer-readable storage medium according to claim 19, the method further comprising:
- simulating the cell with a second defect injected to retrieve a third current waveform at a location where the cell receives a power supply;
- simulating the cell without the second defect injected to retrieve a fourth current waveform at the location where the cell receives the power supply; and
- annotating, responsive to determining that a difference between the third current waveform and the fourth current waveform exceeds the predefined current threshold, the input/output table of the cell with a second indication that the second defect is detectable based on current.

* * * * *